(12) United States Patent
Hsu et al.

(10) Patent No.: US 12,255,645 B2
(45) Date of Patent: Mar. 18, 2025

(54) PROGRAMMING METHOD OF NON-VOLATILE MEMORY CELL

(71) Applicant: eMemory Technology Inc., Hsin-Chu (TW)

(72) Inventors: Chia-Jung Hsu, Hsinchu County (TW); Chun-Yuan Lo, Hsinchu County (TW); Chun-Hsiao Li, Hsinchu County (TW); Chang-Chun Lung, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 125 days.

(21) Appl. No.: 18/227,409

(22) Filed: Jul. 28, 2023

(65) Prior Publication Data

US 2024/0055053 A1 Feb. 15, 2024

Related U.S. Application Data

(60) Provisional application No. 63/397,394, filed on Aug. 12, 2022.

(51) Int. Cl.
*G11C 16/10* (2006.01)
*G11C 16/32* (2006.01)
*G11C 16/34* (2006.01)
*H03K 19/0185* (2006.01)

(52) U.S. Cl.
CPC ... *H03K 19/018528* (2013.01); *G11C 16/102* (2013.01); *G11C 16/32* (2013.01); *G11C 16/3459* (2013.01)

(58) Field of Classification Search
CPC ..... H03K 19/018528; H03K 3/356182; G11C 16/102; G11C 16/32; G11C 16/3459; G11C 7/1057; G11C 7/1084; G11C 8/08
See application file for complete search history.

(56) References Cited

U.S. PATENT DOCUMENTS

2009/0219762 A1\* 9/2009 Mawatari ........... G11C 16/0433
365/185.23

FOREIGN PATENT DOCUMENTS

EP 2498258 B1 1/2016

\* cited by examiner

*Primary Examiner* — Xiaochun L Chen
(74) *Attorney, Agent, or Firm* — WPAT, PC

(57) ABSTRACT

A programming method of a non-volatile memory cell is provided. The non-volatile memory cell includes a memory transistor. Firstly, a current limiter is provided, and the current limiter is connected between a drain terminal of the memory transistor and a ground terminal. Then, a program voltage is provided to a source terminal of the memory transistor, and a control signal is provided to a gate terminal of the memory transistor. In a first time period of a program action, the control signal is gradually decreased from a first voltage value, so that the memory transistor is firstly turned off and then slightly turned on. When the memory transistor is turned on, plural hot electrons are injected into a charge trapping layer of the memory transistor.

13 Claims, 5 Drawing Sheets

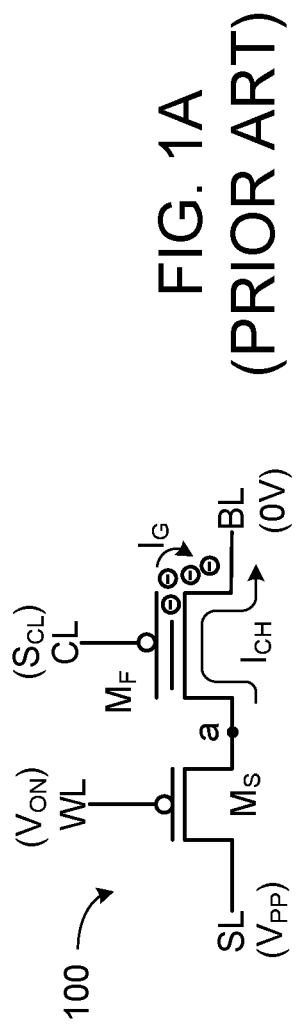
FIG. 1A (PRIOR ART)
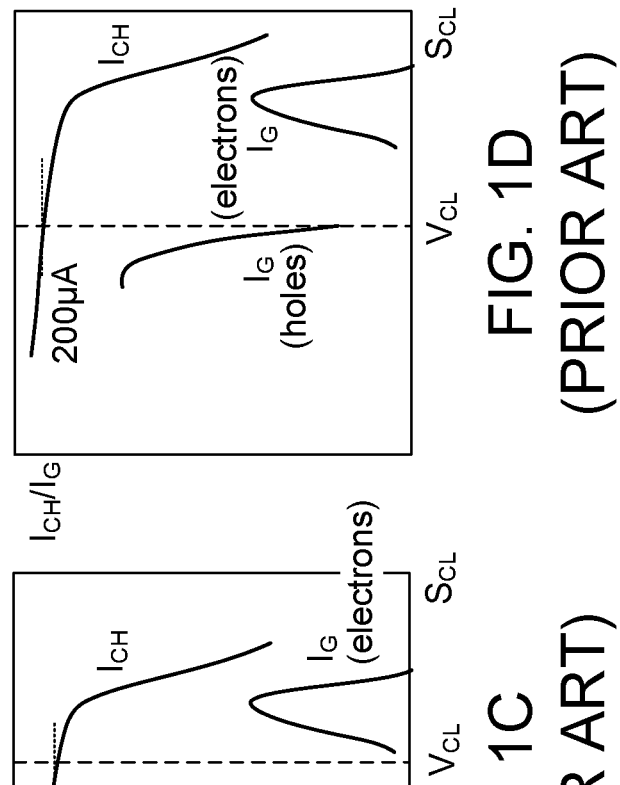
FIG. 1B (PRIOR ART)
FIG. 1C (PRIOR ART)
FIG. 1D (PRIOR ART)

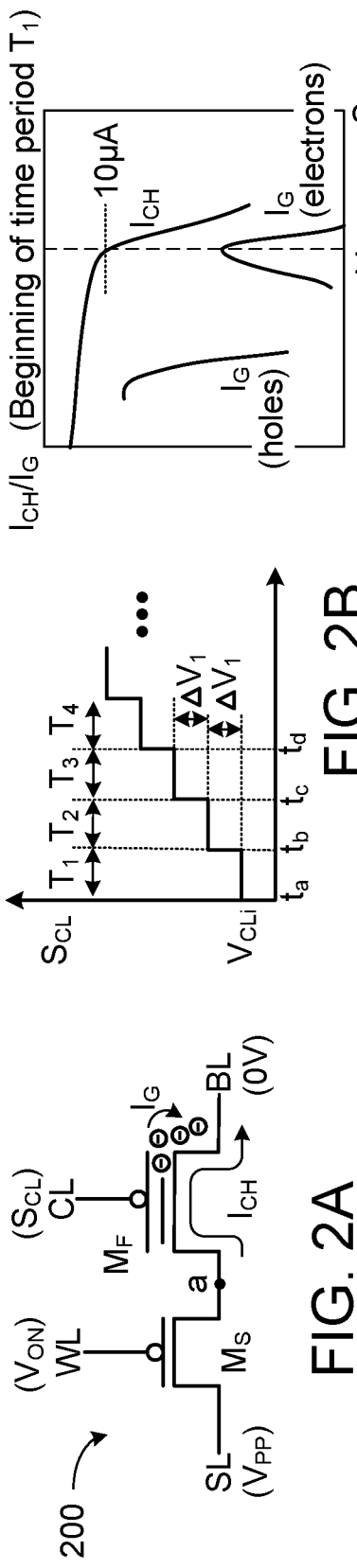
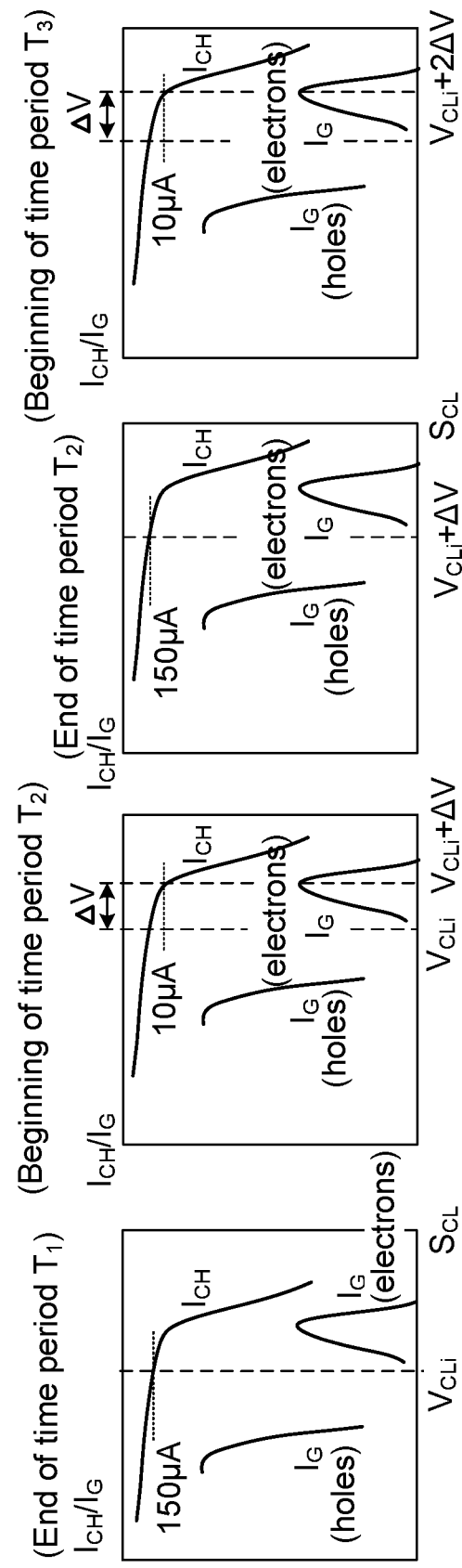

PROGRAMMING METHOD OF NON-VOLATILE MEMORY CELL

This application claims the benefit of U.S. provisional application Ser. No. 63/397,394, filed Aug. 12, 2022, the subject matters of which are incorporated herein by references.

FIELD OF THE INVENTION

The present invention relates to a programming method of a non-volatile memory, and more particularly to a programming method of a non-volatile memory cell with P-type transistors.

BACKGROUND OF THE INVENTION

Generally, a memory cell of a non-volatile memory comprises a storage unit. For example, the storage unit is a memory transistor. According to the number of charges in the charge trapping layer of the memory transistor, a storage state of the memory cell is determined.

FIG. 1A is a schematic circuit diagram of a non-volatile memory cell. As shown in FIG. 1A, the non-volatile memory cell 100 comprises a select transistor $M_S$ and a memory transistor $M_F$. The select transistor $M_S$ and the memory transistor $M_F$ are P-type transistors. In case that no electrons are stored in the charge trapping layer of the memory transistor $M_F$, the non-volatile memory cell 100 is in a first storage state. Whereas, in case that electrons are stored in the charge trapping layer of the memory transistor $M_F$, the non-volatile memory cell 100 is in a second storage state.

The source terminal of the select transistor $M_S$ is connected with a source line SL. The drain terminal of the select transistor $M_S$ is connected with a node a. The gate terminal of the select transistor $M_S$ is connected with a word line WL. The source terminal of the memory transistor $M_F$ is connected with the node a. The drain terminal of the memory transistor $M_F$ is connected with a bit line BL. The gate terminal of the memory transistor $M_F$ is connected with a control line CL.

During a program cycle, a program action of the non-volatile memory cell 100 is performed. Meanwhile, the word line WL receives an on voltage $V_{ON}$, the source line SL receives a program voltage $V_{PP}$, the bit line BL receives a ground voltage (0V), and the control line CL receives a control signal $S_{CL}$.

Since the word line WL receives the on voltage $V_{ON}$, the select transistor MS is fully turned on. Consequently, the program voltage $V_{PP}$ received by the source line SL is transmitted to the node a. That is, when the program action is performed, the voltage at the node a is nearly equal to the program voltage $V_{PP}$. Meanwhile, according to the control signal $S_{CL}$, the hot electrons are injected into the charge trapping layer of the memory transistor $M_F$. Consequently, the storage state of the non-volatile memory cell 100 is changed from the first storage state to the second storage state.

FIGS. 1B, 1C and 1D are plots illustrating associated signals of the memory transistor of FIG. 1A when a program action is performed in response to a fixed control signal $S_{CL}$. For example, the program voltage $V_{PP}$ received by the source line SL is 6V, the on voltage $V_{ON}$ received by the word line WL is 0V, the bit line BL receives the ground voltage (0V), and the control signal $S_{CL}$ is 5.5V. That is, the gate-source voltage $V_{GS}$ of the memory transistor $M_F$ may be calculated according to the formula: $S_{CL}-V_{PP}=5.5V-6V=-0.5V$. Under this circumstance, the threshold voltage Vt of the memory transistor $M_F$ is slightly higher than the gate-source voltage $V_{GS}$ of the memory transistor $M_F$. Consequently, the memory transistor $M_F$ is slightly turned on. For example, in the first storage state, no electrons are stored in the charge trapping layer of the memory transistor $M_F$, and the threshold voltage Vt of the memory transistor $M_F$ is −0.4V.

Please refer to FIG. 1B. In an early stage of the program action, the memory transistor $M_F$ is slightly turned on, and a channel current $I_{CH}$ of the memory transistor $M_F$ is about 10 μA. Under this circumstance, a gate current $I_G$ corresponding to the hot electrons is larger. The flowing direction of the gate current $I_G$ and the injecting direction of the hot electrons are opposite. Meanwhile, since a channel hot hole induced hot electron injection (CHHIHEI) effect is generated, a greater number of hot electrons are injected into the charge trapping layer of the memory transistor $M_F$. As the number of the hot electrons injected into the charge trapping layer is increased, the threshold voltage Vt of the memory transistor $M_F$ is correspondingly increased.

Please refer to FIG. 1C. In the middle stage of the program action, electrons are injected into the charge trapping layer of the memory transistor $M_F$. Consequently, the threshold voltage Vt of the memory transistor $M_F$ is increased. The control signal $S_{CL}$ is not changed. That is, the gate-source voltage $V_{GS}$ of the memory transistor $M_F$ is not changed. Since the difference between the threshold voltage Vt of the memory transistor $M_F$ and the gate-source voltage $V_{GS}$ of the memory transistor $M_F$ is expanded, the memory transistor $M_F$ is further turned on. Under this circumstance, the channel current $I_{CH}$ of the memory transistor $M_F$ is increased to about 150 μA. However, in this situation, the magnitude of the gate current $I_G$ is decreased. That is, the number of hot electrons injected into the charge trapping layer of the memory transistor $M_F$ is decreased.

Please refer to FIG. 1D. In the later stage of the program action, the threshold voltage Vt of the memory transistor $M_F$ is gradually continuously increased. Consequently, the difference between the threshold voltage Vth of the memory transistor $M_F$ and the gate-source voltage $V_{GS}$ of the memory transistor $M_F$ is continuously expanded. Meanwhile, the memory transistor $M_F$ is fully turned on. Under this circumstance, the channel current $I_{CH}$ of the memory transistor $M_F$ is increased to about 200 μA. Meanwhile, since a channel hot hole injection effect (CHHI) effect is generated, hot holes are injected into the charge trapping layer of the memory transistor $M_F$, and the magnitude of the gate current $I_G$ is gradually increased. However, since hot holes are injected into the charge trapping layer of the memory transistor $M_F$, the reliability of the non-volatile memory cell 100 is deteriorated.

As mentioned in FIGS. 1A to 1D, the memory transistor $M_F$ of the non-volatile memory cell 100 is slightly turned on in the early stage of the program action only. Meanwhile, the gate current $I_G$ is larger. That is, more hot electrons are injected into the charge trapping layer of the memory transistor $M_F$.

After the middle stage of the program action, the threshold voltage Vt of the memory transistor $M_F$ is increased. Meanwhile, the channel voltage $I_{CH}$ of the memory transistor $M_F$ is increased. However, the magnitude of the gate current $I_G$ is decreased. The decreased gate current $I_G$ indicates that a smaller number of hot electrons are injected into the charge trapping layer. In other words, the increased channel current $I_{CH}$ cannot enhance the program efficiency but increase the power consumption of the program action.

Under this circumstance, the reliability of the non-volatile memory cell 100 is deteriorated.

Moreover, if the number of hot electrons injected into the charge trapping layer is not sufficient in the early stage of the program action, the non-volatile memory cell is insufficiently programmed. Under this circumstance, the second storage state of the non-volatile memory cell cannot be normally judged.

SUMMARY OF THE INVENTION

An embodiment of the present invention provides a programming method of a non-volatile memory cell. The non-volatile memory cell includes a memory transistor. The method includes steps of: limiting a channel current of the memory transistor lower than or equal to a limited current; and providing a program voltage to a source terminal of the memory transistor, and providing a control signal to a gate terminal of the memory transistor. During a program cycle, a program action is performed, and the program cycle contains plural time periods. In a first time period of the plural time periods, the control signal is gradually decreased from a first voltage value, so that the memory transistor is firstly turned off and then turned on. When the memory transistor is turned on, plural hot electrons are injected into the memory transistor. In a second time period of the plural time periods after the first time period, the control signal is gradually decreased from a second voltage value, so that the memory transistor is firstly turned off and then turned on. When the memory transistor is turned on, the plural hot electrons are injected into the memory transistor. The second voltage value is equal to the first voltage value plus a first voltage increment.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1A (prior art) is a schematic circuit diagram of a non-volatile memory cell;

FIGS. 1B, 1C and 1D (prior art) are plots illustrating associated signals of the memory transistor of FIG. 1A when a program action is performed in response to a fixed control signal;

FIG. 2A is a schematic circuit diagram of a non-volatile memory cell;

FIG. 2B is a schematic timing diagram illustrating a waveform of a ramped-up control signal when a program action is performed according to a first embodiment of the present invention;

FIGS. 2C, 2D, 2E, 2F and 2G are plots illustrating associated signals of the memory transistor of FIG. 2A when the program action is performed in response to the ramped-up control signal;

DETAILED DESCRIPTION OF PREFERRED EMBODIMENTS

Figure 3A:
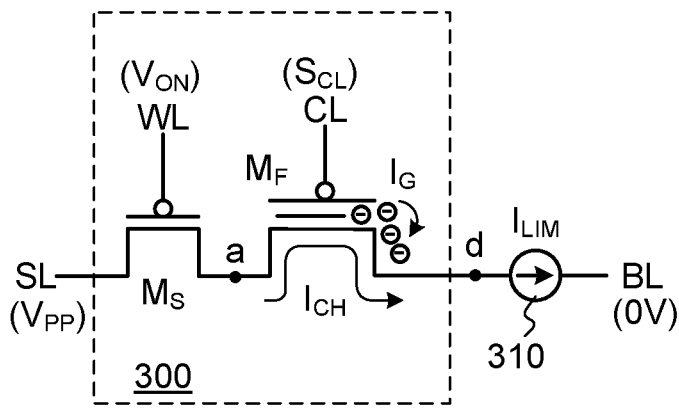
FIG. 3A is a schematic circuit diagram of a non-volatile memory cell.

In order to inject sufficient number of hot electrons into the memory transistor during the program action, the present invention provides a programming method of a non-volatile memory cell. Hereinafter, some embodiments of the programming method will be described. In some embodiments, the memory transistor can be a charge-trapping type memory transistor, for example, a Silicon-Oxide-Nitride-Oxide-Silicon (SONOS) transistor.

Please refer to FIGS. 2A to 2G. FIG. 2A is a schematic circuit diagram of a non-volatile memory cell. FIG. 2B is a schematic timing diagram illustrating a waveform of a ramped-up control signal $S_{CL}$ when a program action is performed according to a first embodiment of the present invention. FIGS. 2C, 2D, 2E, 2F and 2G are plots illustrating associated signals of the memory transistor of FIG. 2A when the program action is performed in response to the ramped-up control signal $S_{CL}$. During a program cycle, a program action of the non-volatile memory cell 200 is performed. In this embodiment, the program cycle contains plural time period. The circuitry structure of the non-volatile memory cell 200 as shown in FIG. 2A is similar to that of the non-volatile memory cell as shown in FIG. 1A, and not redundantly described herein.

As shown in FIG. 2B, the program action is started after the time point ta. In the time period $T_1$ between the time point ta and the time point $t_b$, the control signal $S_{CL}$ is a pulse with 100% duty cycle. The pulse height is equal to an initial voltage $V_{CLi}$. That is, in the time period $T_1$, the control signal $S_{CL}$ is equal to the initial voltage $V_{CLi}$.

In the time period $T_2$ between the time point $t_b$ and the time point $t_c$, the control signal $S_{CL}$ is a pulse with 100% duty cycle. The pulse height is equal to the initial voltage $V_{CLi}$ plus a voltage increment $\Delta V_1$. That is, in the time period $T_2$, the control signal $S_{CL}$ is equal to $V_{CLi} \Delta V_1$. The voltage increment $\Delta V_1$ is greater than zero.

In the time period $T_3$ between the time point $t_c$ and the time point $t_d$, the control signal $S_{CL}$ is a pulse with 100% duty cycle. The pulse height is equal to the initial voltage $V_{CLi}$ plus two times the voltage increment $\Delta V_1$. That is, in the time period $T_3$, the control signal $S_{CL}$ is equal to $V_{CLi}+2\Delta V_1$.

The rest may be deduced by analogy. That is, in the other time periods of the program cycle, the control signal $S_{CL}$ is ramped up.

When a program action of the non-volatile memory cell 200 is performed, the word line WL receives an on voltage $V_{ON}$, the source line SL receives a program voltage $V_{PP}$, the bit line BL receives a ground voltage (0V), and the control line CL receives a control signal $S_{CL}$. Since the word line WL receives the on voltage $V_{ON}$, the select transistor $M_S$ is fully turned on. Consequently, the program voltage $V_{PP}$ received by the source line SL is transmitted to the node a. That is, when the program action is performed, the voltage at the source terminal of the memory transistor $M_F$ is nearly equal to the program voltage $V_{PP}$. Meanwhile, according to the ramped-up control signal $S_{CL}$, the hot electrons are injected into the charge trapping layer of the memory transistor $M_F$. Consequently, the storage state of the non-volatile memory cell 200 is changed from the first storage state to the second storage state.

For example, the program voltage $V_{PP}$ received by the source line SL is 6V, the on voltage $V_{ON}$ received by the word line WL is 0V, and the ground voltage received by the bit line BL is 0V. In addition, the initial voltage $V_{CLi}$ is 5.5V, and the voltage increment $\Delta V_1$ is 0.2V.

In the time period $T_1$ of the program action, the gate-source voltage $V_{GS}$ of the memory transistor $M_F$ may be calculated according to the formula: $V_{CLi}-V_{PP}=5.5V-6V=-0.5V$. Under this circumstance, the threshold voltage Vt of the memory transistor $M_F$ is slightly higher than the gate-source voltage $V_{GS}$ of the memory transistor $M_F$. Consequently, the memory transistor $M_F$ is slightly turned on. For example, in the first storage state, no electrons are stored in the charge trapping layer of the memory transistor $M_F$, and the threshold voltage Vt of the memory transistor $M_F$ is $-0.4V$.

Please refer to FIG. 2C. In the beginning of the time period $T_1$ (i.e., after the time point $t_a$), the memory transistor $M_F$ is slightly turned on, and a channel current $I_{CH}$ of the memory transistor $M_F$ is about 10 μA. Meanwhile, since a channel hot hole induced hot electron injection (CHHIHEI) effect is generated, a gate current $I_G$ corresponding to the hot electrons is larger. Consequently, a greater number of hot electrons are injected into the charge trapping layer of the memory transistor $M_F$. As the number of the hot electrons is increased, the threshold voltage Vt of the memory transistor $M_F$ is correspondingly increased.

Please refer to FIG. 2D. At the end of the time period $T_1$ (i.e., before the time point $t_b$), the threshold voltage Vt of the memory transistor $M_F$ is increased. Since the difference between the threshold voltage Vt of the memory transistor $M_F$ and the gate-source voltage $V_{GS}$ of the memory transistor $M_F$ is expanded, the memory transistor $M_F$ is further turned on. Under this circumstance, the channel current $I_{CH}$ of the memory transistor $M_F$ is increased to about 150 μA. However, in this situation, the magnitude of the gate current $I_G$ is decreased. That is, the number of hot electrons injected into the charge trapping layer of the memory transistor $M_F$ is decreased.

Please refer to FIG. 2E. In the beginning of the time period $T_2$ (i.e., after the time point $t_b$), the control signal $S_{CL}$ is increased to ($V_{CLi}+\Delta V_1$), and the gate-source voltage $V_{GS}$ of the memory transistor $M_F$ is increased. Under this circumstance, the threshold voltage Vt of the memory transistor $M_F$ is slightly higher than the gate-source voltage $V_{GS}$ of the memory transistor $M_F$. Consequently, the memory transistor $M_F$ is slightly turned on. Under this circumstance, the channel current $I_{CH}$ of the memory transistor $M_F$ is decreased to about 10 μA. Meanwhile, since the CHHIHEI effect is generated, a gate current $I_G$ corresponding to the hot electrons is larger. Consequently, a greater number of hot electrons are injected into the charge trapping layer of the memory transistor $M_F$. As the number of the hot electrons is increased, the threshold voltage Vt of the memory transistor $M_F$ is correspondingly increased.

Please refer to FIG. 2F. At the end of the time period $T_2$ (i.e., before the time point $t_c$), the threshold voltage Vt of the memory transistor $M_F$ is increased. Since the difference between the threshold voltage Vt of the memory transistor $M_F$ and the gate-source voltage $V_{GS}$ of the memory transistor $M_F$ is expanded, the memory transistor $M_F$ is further turned on. Under this circumstance, the channel current $I_{CH}$ of the memory transistor $M_F$ is increased to about 150 μA. However, in this situation, the magnitude of the gate current $I_G$ is decreased. That is, the number of hot electrons injected into the charge trapping layer of the memory transistor $M_F$ is decreased.

Please refer to FIG. 2G. Similarly, in the beginning of the time period $T_3$ (i.e., after the time point $t_c$), the control signal $S_{CL}$ is ($V_{CLi}+2\Delta V_1$), and the gate-source voltage $V_{GS}$ of the memory transistor $M_F$ is increased. Under this circumstance, the threshold voltage Vt of the memory transistor $M_F$ is slightly higher than the gate-source voltage $V_{GS}$ of the memory transistor $M_F$. Consequently, the memory transistor $M_F$ is slightly turned on. Under this circumstance, the channel current $I_{CH}$ of the memory transistor $M_F$ is decreased to about 10 μA. Meanwhile, since the CHHIHEI effect is generated, a greater number of hot electrons are injected into the charge trapping layer of the memory transistor $M_F$. As the number of the hot electrons is increased, the threshold voltage Vt of the memory transistor $M_F$ is correspondingly increased.

The rest may be deduced by analogy. In the time period $T_4$, the control signal $S_{CL}$ is increased to ($V_{CLi}+3\Delta V_1$). During the program action, the memory transistor $M_F$ of the non-volatile memory cell 200 is switched between the slightly-turned-on state and the further-turned on state according to the ramped-up control signal $S_{CL}$. In this way, the CHHIHEI effect can be continuously generated. Consequently, sufficient hot electrons can be injected into the charge trapping layer of the memory transistor $M_F$ during the program action.

As can be seen from the above descriptions of FIGS. 2A to 2G, the memory transistor $M_F$ is maintained in the on state and the control signal $S_{CL}$ is gradually increased to adjust the turn-on extent of the memory transistor $M_F$ when the program action of the non-volatile memory cell 200 is performed. As a consequence, more hot electrons can be injected into the charge trapping layer of the memory transistor $M_F$. However, in the latter part of each time period, the channel current $I_{CH}$ still rises. In other word, the power consumption during the program action is still high.

In order to reduce the power consumption of the non-volatile memory cell 200 during the program action, the above embodiment needs to be modified. For example, in another embodiment, the non-volatile memory cell is further connected with a current limiter, and the program action is controlled according to the control signal $S_{CL}$ of the first embodiment.

Figure 3B:
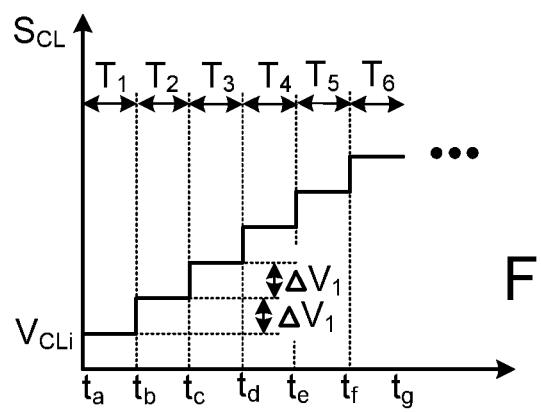
FIG. 3B is a schematic timing diagram illustrating a waveform of a ramped-up control signal when a program action is performed according to a second embodiment of the present invention.

FIG. 3A is a schematic circuit diagram of a non-volatile memory cell. FIG. 3B is a schematic timing diagram illustrating a waveform of a ramped-up control signal $S_{CL}$ when a program action is performed according to a second embodiment of the present invention. In comparison with the non-volatile memory cell 200 shown in FIG. 2A, the non-volatile memory cell 300 of this embodiment is further connected with a current limiter 310. As shown in FIG. 3B, the control signal $S_{CL}$ for controlling the program action is similar to that of FIG. 2B.

In the non-volatile memory cell 300, the source terminal of the select transistor $M_S$ is connected with a source line SL. The drain terminal of the select transistor $M_S$ is connected with the node a. The gate terminal of the select transistor $M_S$ is connected with the word line WL. The source terminal of the memory transistor $M_F$ is connected with the node a. The drain terminal of the memory transistor $M_F$ is connected with a node d. The gate terminal of the memory transistor $M_F$ is connected with a control line CL.

The current limiter 310 is connected between the node d and a bit line BL. The current limiter 310 is a current source for providing a limited current $I_{LIM}$.

When the program action of the non-volatile memory cell 300 is performed, the current limiter 310 is connected between the drain terminal of the memory transistor $M_F$ and the bit line BL. Moreover, the word line WL receives an on voltage $V_{ON}$, the source line SL receives a program voltage $V_{PP}$, the bit line BL receives a ground voltage (0V), and the control line CL receives a control signal $S_{CL}$. For example, the program voltage $V_{PP}$ is 6V, the on voltage $V_{ON}$ is 0V, and the ground voltage is 0V. Moreover, the initial voltage $V_{CLi}$ is 5.5V, the voltage increment $\Delta V_1$ is 0.2V, and the magnitude of the limited current $I_{LIM}$ is 20 μA. In other words, the maximum of the channel current $I_{CH}$ of the memory transistor $M_F$ is limited to 20 μA by the current limiter 310, and the magnitude of the channel current $I_{CH}$ is lower than or equal to the limited current $I_{LIM}$.

As mentioned above, when the program action is performed, the non-volatile memory cell 300 connected with the current limiter 310 is controlled according to the ramped-up control signal $S_{CL}$. However, the program efficiency of this control method is largely deteriorated. The reason will be described as follows.

Figure 3C:
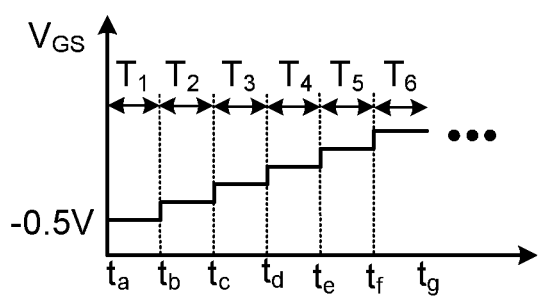
FIG. 3C is a schematic timing diagram illustrating the change of a gate-source voltage $V_{GS}$ of the memory transistor $M_F$ in the non-volatile memory cell according to the second embodiment of the present invention.
Figure 3D:
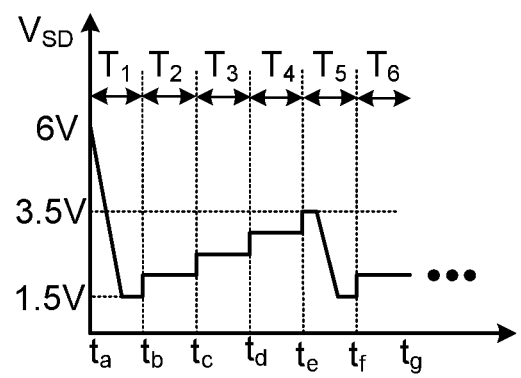
FIG. 3D is a schematic timing diagram illustrating the change of a source-drain voltage $V_{SD}$ of the memory transistor $M_F$ in the non-volatile memory cell according to the second embodiment of the present invention.

FIG. 3C is a schematic timing diagram illustrating the change of a gate-source voltage $V_{GS}$ of the memory transistor $M_F$ in the non-volatile memory cell according to the second embodiment of the present invention. FIG. 3D is a schematic timing diagram illustrating the change of a source-drain voltage $V_{SD}$ of the memory transistor $M_F$ in the non-volatile memory cell according to the second embodiment of the present invention. For example, in the first storage state, no electrons are stored in the charge trapping layer of the memory transistor $M_F$. Under this circumstance, the threshold voltage Vt is −0.4V.

In the beginning of the time period $T_1$ (i.e., after the time point $t_a$), the gate-source voltage $V_{GS}$ of the memory transistor $M_F$ may be calculated according to the formula: $V_{CLi}-V_{PP}=5.5V-6V=-0.5V$. Under this circumstance, the threshold voltage Vt of the memory transistor $M_F$ is slightly higher than the gate-source voltage $V_{GS}$ of the memory transistor $M_F$. Consequently, the memory transistor $M_F$ is slightly turned on, and a channel current $I_{CH}$ of the memory transistor $M_F$ is about 10 μA. Meanwhile, since the CHHIHEI effect is generated, a gate current $I_G$ corresponding to the hot electrons is larger. Consequently, a greater number of hot electrons are injected into the charge trapping layer of the memory transistor $M_F$. As the number of the hot electrons is increased, the threshold voltage Vt of the memory transistor $M_F$ is correspondingly increased.

At the end of the time period $T_1$ (i.e., before the time point $t_b$), the threshold voltage Vt of the memory transistor $M_F$ is increased. Since the difference between the threshold voltage Vt of the memory transistor $M_F$ and the gate-source voltage $V_{GS}$ of the memory transistor $M_F$ is expanded, the memory transistor $M_F$ is further turned on. However, since the limited current $I_{LIM}$ is 20 μA, the channel current $I_{CH}$ of the memory transistor $M_F$ is maintained at about 20 μA. Under this circumstance, the drain voltage of the memory transistor $M_F$ (i.e., the voltage at the node d) is increased to about 4.5V. Meanwhile, the source-drain voltage $V_{SD}$ of the memory transistor $M_F$ is 1.5V (i.e., 6V−4.5V=1.5V). Since the source-drain voltage $V_{SD}$ of the memory transistor $M_F$ is too low, the CHHIHEI effect cannot be generated.

In the time period $T_2$ (i.e., the interval between the time point to and the time point $t_a$), the control signal $S_{CL}$ is increased by one voltage increment $\Delta V_1$. Consequently, the gate-source voltage $V_{GS}$ of the memory transistor $M_F$ is increased. Under this circumstance, the voltage at the node d is decreased to 4.0V, and the source-drain voltage $V_{SD}$ of the memory transistor $M_F$ is increased to about 2.0V. Since the source-drain voltage $V_{SD}$ of the memory transistor $M_F$ is too low, the CHHIHEI effect cannot be generated.

In the time period $T_3$ (i.e., in the time interval between the time point $t_c$ and the time point $t_d$), the control signal $S_{CL}$ is increased by one additional voltage increment $\Delta V_1$. Consequently, the gate-source voltage $V_{GS}$ of the memory transistor $M_F$ is increased. Meanwhile, the voltage at the node d is decreased to 3.5V, and the source-drain voltage $V_{SD}$ of the memory transistor $M_F$ is increased to about 2.5V. Since the source-drain voltage $V_{SD}$ of the memory transistor $M_F$ is too low, the CHHIHEI effect cannot be generated.

In the time period $T_4$ (i.e., in the time interval between the time point $t_e$ and the time point $t_f$), the control signal $S_{CL}$ is increased by one additional voltage increment $\Delta V_1$ again. Consequently, the gate-source voltage $V_{GS}$ of the memory transistor $M_F$ is increased. Meanwhile, the voltage at the node d is decreased to 3.0V, and the source-drain voltage $V_{SD}$ of the memory transistor $M_F$ is increased to about 3.0V. Since the source-drain voltage $V_{SD}$ of the memory transistor $M_F$ is too low, the CHHIHEI effect cannot be generated.

In the beginning of the time period $T_5$ (i.e., after the time point $t_e$), the control signal $S_{CL}$ is increased by one additional voltage increment $\Delta V_1$ again. Consequently, the gate-source voltage $V_{GS}$ of the memory transistor $M_F$ is increased. Meanwhile, the voltage at the node d is decreased to 2.5V, and the source-drain voltage $V_{SD}$ of the memory transistor $M_F$ is increased to about 3.5V. Since the source-drain voltage $V_{SD}$ is 3.5V, the CHHIHEI effect can be generated. Consequently, hot electrons are injected into the charge trapping layer of the memory transistor $M_F$ again.

At the end of the time period $T_5$ (i.e., before the time point $t_f$), the threshold voltage Vt of the memory transistor $M_F$ is increased. Since the difference between the threshold voltage Vt of the memory transistor $M_F$ and the gate-source voltage $V_{GS}$ of the memory transistor $M_F$ is expanded, the memory transistor $M_F$ is further turned on. However, since the limited current $I_{LIM}$ is 20 μA, the channel current $I_{CH}$ of the memory transistor $M_F$ is maintained at about 20 μA. Under this circumstance, the drain voltage of the memory transistor $M_F$ (i.e., the voltage at the node d) is increased to about 4.5V. Meanwhile, the source-drain voltage $V_{SD}$ of the memory transistor $M_F$ is 1.5V (i.e., 6V−4.5V=1.5V). Since the source-drain voltage $V_{SD}$ of the memory transistor $M_F$ is too low, the CHHIHEI effect cannot be generated.

Similarly, in the time period $T_6$ (i.e., in the time interval between the time point $t_f$ and the time point $t_g$), the control signal $S_{CL}$ is increased by one additional voltage increment $\Delta V_1$ again. Consequently, the gate-source voltage $V_{GS}$ of the memory transistor $M_F$ is increased. Meanwhile, the voltage at the node d is decreased to 4.0V, and the source-drain voltage $V_{SD}$ of the memory transistor $M_F$ is increased to about 2.0V. Since the source-drain voltage $V_{SD}$ of the memory transistor $M_F$ is too low, the CHHIHEI effect cannot be generated.

The rest may be deduced by analogy. The control signal $S_{CL}$ is gradually continuously increased. For example, the CHHIHEI effect is not generated until a time period $T_9$ (not shown). In the time period $T_9$, the CHHIHEI effect is generated. Consequently, hot electrons are injected into the charge trapping layer of the memory transistor $M_F$ again.

As mentioned above, the non-volatile memory cell 300 is connected with the current limiter during the program action. In addition, the program action is controlled according to the control signal $S_{CL}$ as shown in FIG. 3B. In this way, the memory transistor $M_F$ is continuously turned on. However, since the source-drain voltage $V_{SD}$ of the memory transistor $M_F$ is too low, the program efficiency is deteriorated.

Figure 4A:
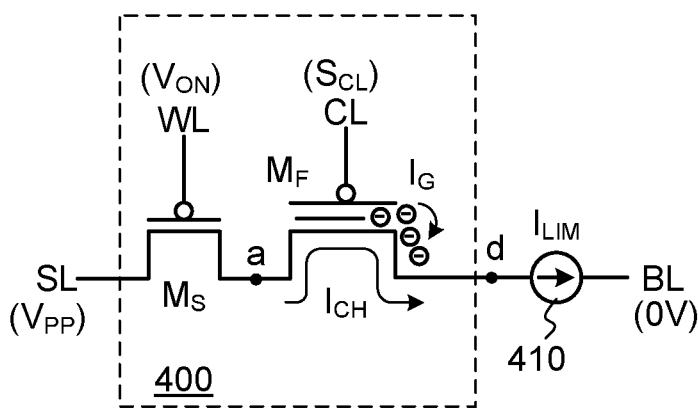
FIG. 4A is a schematic circuit diagram of a non-volatile memory cell.
Figure 4B:
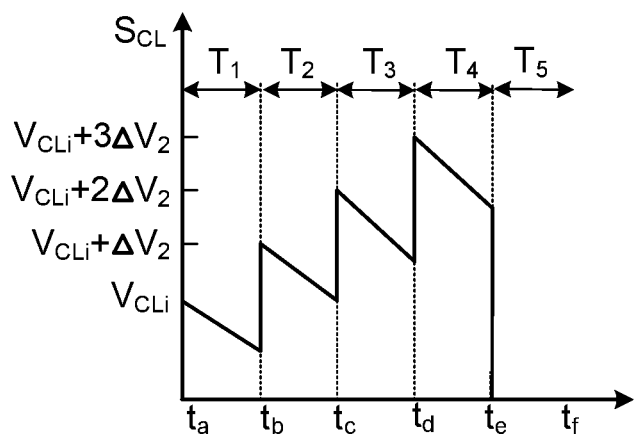
FIG. 4B is a schematic timing diagram illustrating a waveform of a control signal when a program action is performed according to a third embodiment of the present invention.

FIG. 4A is a schematic circuit diagram of a non-volatile memory cell. FIG. 4B is a schematic timing diagram illustrating a waveform of a control signal $S_{CL}$ when a program action is performed according to a third embodiment of the present invention. During a program cycle, a program action of the non-volatile memory cell 400 is performed. In this embodiment, the program cycle contains plural time period. The circuitry structure of the non-volatile memory cell 400 of this embodiment is identical to the non-volatile memory cell 300 shown in FIG. 3A. The non-volatile memory cell 400 of this embodiment is connected with a current limiter 410. The connecting relationships between the associated components are not redundantly described herein.

When the program action of the non-volatile memory cell 400 is performed, the current limiter 410 is connected between the drain terminal of the memory transistor $M_F$ and the bit line BL. Moreover, the word line WL receives an on voltage $V_{ON}$, the source line SL receives a program voltage $V_{PP}$, the bit line BL receives a ground voltage (0V), and the control line CL receives a control signal $S_{CL}$. Since the word line WL receives the on voltage $V_{ON}$, the select transistor $M_S$ is fully turned on. Consequently, the program voltage $V_{PP}$ received by the source line SL is transmitted to the node a. That is, when the program action is performed, the voltage at the source terminal of the memory transistor $M_F$ is nearly equal to the program voltage $V_{PP}$. That is, when the program action is performed, the voltage at the node a is nearly equal to the program voltage $V_{PP}$. Meanwhile, according to the control signal $S_{CL}$, hot electrons are injected into the charge trapping layer of the memory transistor $M_F$. Consequently, the storage state of the non-volatile memory cell 400 is changed from the first storage state to the second storage state.

For example, the program voltage $V_{PP}$ is 6V, and the on voltage $V_{ON}$ is 0V. Moreover, the initial voltage $V_{CLi}$ is 6V, the voltage increment $\Delta V_2$ is 0.5V, and the magnitude of the limited current $I_{LIM}$ is 20 μA. In other words, the maximum of the channel current $I_{CH}$ of the memory transistor $M_F$ is limited to 20 μA by the current limiter 410.

In the above-described embodiment, the channel current $I_{CH}$ of the memory transistor $M_F$ is limited by the current limiter 410. In another embodiment, the current limiter 410 shown in FIG. 4A may be omitted, and the select transistor $M_S$ can be used as the current limiter to limit the channel current $I_{CH}$ of the memory transistor $M_F$. For example, when the program action of the non-volatile memory cell 400 is performed, a higher on voltage $V_{ON}$ may applied to the word line WL to control the select transistor $M_S$ not to be completely turned on, thereby limiting the conductivity capability of the select transistor $M_S$ to determine a limited current. In this way, the channel current $I_{CH}$ of the memory transistor $M_F$ is lower than or equal to a limited current $I_{LIM}$ determined by the on voltage $V_{ON}$. The on voltage $V_{ON}$ is greater than 0V, e.g. 4V.

In this embodiment, the control signal $S_{CL}$ is adjusted when the program action is performed. Consequently, the non-volatile memory cell 400 is selectively operated in an off state or a slightly-turned-on state. The associated operations will be described in more details as follows.

In this embodiment, the control signal $S_{CL}$ is adjusted during the program action. For example, in each time period of the program action, the control signal $S_{CL}$ is firstly increased and then gradually decreased. Correspondingly, the memory transistor $M_F$ is firstly turned off, and then the memory transistor $M_F$ is slightly turned on. Hereinafter, a program cycle with four time periods $T_1$~$T_4$ will be taken as an example. It is noted that the number of the time periods in the program cycle may be increased or decreased according to the practical requirements.

Please refer to FIG. 4B. The time interval between the time point $t_a$ and the time point $t_b$ is the time period $T_1$. At the time point $t_a$, the control signal $S_{CL}$ is equal to an initial voltage $V_{CLi}$. Then, the control signal $S_{CL}$ is gradually decreased from the initial voltage $V_{CLi}$. In other words, in the time period $T_1$, the control signal $S_{CL}$ starts to be decreased from the initial voltage $V_{CLi}$.

The time interval between the time point $t_b$ and the time point $t_c$ is the time period $T_2$. At the time point $t_b$, the control signal $S_{CL}$ is equal to the initial voltage $V_{CLi}$ plus one voltage increment $\Delta V_2$. Then, the control signal $S_{CL}$ is gradually decreased from the voltage ($V_{CLi}+\Delta V_2$). In other words, in the time period $T_2$, the control signal $S_{CL}$ starts to be decreased from the voltage ($V_{CLi}+\Delta V_2$). The voltage increment $\Delta V_2$ is greater than zero.

The time interval between the time point $t_c$ and the time point $t_d$ is the time period $T_3$. At the time point $t_c$, the control signal $S_{CL}$ is equal to the initial voltage $V_{CLi}$ plus two times the voltage increment $\Delta V_2$. Then, the control signal $S_{CL}$ is gradually decreased from the voltage ($V_{CLi}+2\Delta V_2$). In other words, in the time period $T_3$, the control signal $S_{CL}$ starts to be decreased from the voltage ($V_{CLi}+2\Delta V_2$).

The time interval between the time point $t_d$ and the time point to is the time period $T_4$. At the time point $t_d$, the control signal $S_{CL}$ is equal to the initial voltage $V_{CLi}$ plus three times the voltage increment $\Delta V_2$. Then, the control signal $S_{CL}$ is gradually decreased from the voltage ($V_{CLi}+3\Delta V_2$). In other words, in the time period $T_4$, the control signal $S_{CL}$ starts to be decreased from the voltage ($V_{CLi}+3\Delta V_2$).

Figure 4C:
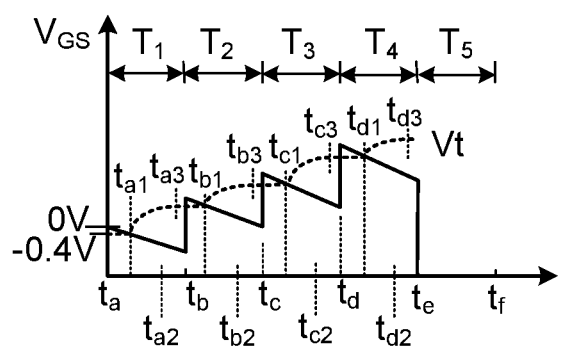
FIG. 4C is a schematic timing diagram illustrating the change of a gate-source voltage $V_{GS}$ of the memory transistor $M_F$ in the non-volatile memory cell according to the third embodiment of the present invention.
Figure 4D:
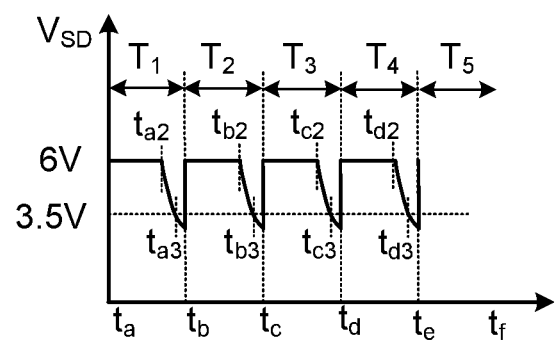
FIG. 4D is a schematic timing diagram illustrating the change of a source-drain voltage $V_{SD}$ of the memory transistor $M_F$ in the non-volatile memory cell according to the third embodiment of the present invention.

FIG. 4C is a schematic timing diagram illustrating the change of a gate-source voltage $V_{GS}$ of the memory transistor $M_F$ in the non-volatile memory cell according to the third embodiment of the present invention. FIG. 4D is a schematic timing diagram illustrating the change of a source-drain voltage $V_{SD}$ of the memory transistor $M_F$ in the non-volatile memory cell according to the third embodiment of the present invention. For example, in the first storage state, no electrons are stored in the charge trapping layer of the memory transistor $M_F$. Under this circumstance, the threshold voltage Vt is −0.4V.

In the beginning of the time period $T_1$ (i.e., at the time point $t_a$), the control signal $S_{CL}$ is 6V. The gate-source voltage $V_{GS}$ of the memory transistor $M_F$ may be calculated according to the formula: $V_{CLi}-V_{PP}=6V-6V=0V$. Under this circumstance, the threshold voltage Vt of the memory transistor $M_F$ is lower than the gate-source voltage $V_{GS}$ of the memory transistor $M_F$. Consequently, the memory transistor $M_F$ is turned off. Under this circumstance, the voltage at the node d is equal to the ground voltage (0V). That is, the source-drain voltage $V_{SD}$ of the memory transistor $M_F$ is 6V.

After the time point $t_a$, the control signal $S_{CL}$ is gradually continuously decreased. At the time point $t_{a1}$, the gate-source voltage $V_{GS}$ of the memory transistor $M_F$ is equal to the threshold voltage Vt of the memory transistor $M_F$. Under this circumstance, the memory transistor $M_F$ is ready to be turned on, and the channel current $I_{CH}$ is equal to zero.

In the time interval between the time point $t_{a1}$ and the time point $t_{a2}$, the gate-source voltage $V_{GS}$ of the memory transistor $M_F$ is lower than the threshold voltage Vt of the memory transistor $M_F$. Consequently, the memory transistor $M_F$ is slightly turned on, and the channel current $I_{CH}$ is generated. Meanwhile, since the CHHIHEI effect is generated, the gate current $I_G$ corresponding to the hot electrons is larger. Consequently, a greater number of hot electrons are injected into the charge trapping layer of the memory transistor $M_F$.

In the time interval between the time point $t_{a1}$ and time point $t_{a2}$, the threshold voltage Vt of the memory transistor $M_F$ is correspondingly increased with the increasing number of the hot electrons injected into the charge trapping layer. In addition, control signal $S_{CL}$ is gradually continuously decreased. Consequently, the difference between the gate-source voltage $V_{GS}$ of the memory transistor $M_F$ and the threshold voltage Vt of the memory transistor $M_F$ is gradually increased. Under this circumstance, the channel current $I_{CH}$ is gradually increased, but the magnitude of the channel current $I_{CH}$ is lower than the magnitude of the magnitude of the limited current $I_{LIM}$. That is, the magnitude of the channel current $I_{CH}$ is lower than 20 μA.

In the time interval between the time point $t_{a2}$ and the time point $t_{a3}$, the magnitude of the channel current $I_{CH}$ reaches 20 μA. That is, the magnitude of the channel current is equal to the magnitude of the limited current $I_{LIM}$. Since the channel current $I_{CH}$ is unable to be increased and the difference between the gate-source voltage $V_{GS}$ of the memory transistor $M_F$ and the threshold voltage Vt of the memory transistor $M_F$ is gradually increased, the voltage at the node d is increased. That is, the source-drain voltage $V_{SD}$ of the memory transistor $M_F$ is decreased. Under this circumstance, the source-drain voltage $V_{SD}$ of the memory transistor $M_F$ is still higher than 3.5V. Consequently, the CHEI effect is continuously generated, and hot electrons are injected into the charge trapping layer of the memory transistor $M_F$.

In the time interval between the time point $t_{a3}$ and the time point $t_b$, the difference between the gate-source voltage $V_{GS}$ of the memory transistor $M_F$ and the threshold voltage Vt is gradually increased. Consequently, the source-drain voltage $V_{SD}$ of the memory transistor $M_F$ is gradually continuously decreased. In addition, after the time point tab, the source-drain voltage $V_{SD}$ of the memory transistor $M_F$ is lower than 3.5V. Meanwhile, the CHHIHEI effect cannot be generated. Consequently, the hot electrons are no longer injected into the charge trapping layer of the memory transistor $M_F$, and the threshold voltage Vt is not changed.

In the beginning of the time period $T_2$ (i.e., at the time point $t_b$), the control signal $S_{CL}$ is increased to ($V_{CLi}+\Delta V_2$). Under this circumstance, the threshold voltage Vt of the memory transistor $M_F$ is lower than the gate-source voltage $V_{GS}$ of the memory transistor $M_F$. Consequently, the memory transistor $M_F$ is turned off. Under this circumstance, the voltage at the node d is equal to the ground voltage (0V). That is, the source-drain voltage $V_{SD}$ of the memory transistor $M_F$ is 6V.

After the time point $t_b$, the control signal $S_{CL}$ is decreased. At the time point $t_{b1}$, the gate-source voltage $V_{GS}$ of the memory transistor $M_F$ is equal to the threshold voltage Vt of the memory transistor $M_F$. Meanwhile, the memory transistor $M_F$ is ready to be turned on, and the channel current $I_{CH}$ is zero.

In the time interval between the time point $t_{b1}$ and the time point $t_{b2}$, the gate-source voltage $V_{GS}$ of the memory transistor $M_F$ is lower than the threshold voltage Vt of the memory transistor $M_F$. Consequently, the memory transistor $M_F$ is slightly turned on, and the channel current $I_{CH}$ is generated. Meanwhile, since the CHHIHEI effect is generated, the gate current $I_G$ corresponding to the hot electrons is larger. Consequently, a greater number of hot electrons are injected into the charge trapping layer of the memory transistor $M_F$.

In the time interval between the time point $t_{b1}$ and time point $t_{b2}$, the threshold voltage Vt of the memory transistor $M_F$ is correspondingly increased with the increasing number of the hot electrons injected into the charge trapping layer. In addition, control signal $S_{CL}$ is gradually continuously decreased. Consequently, the difference between the gate-source voltage $V_{GS}$ of the memory transistor $M_F$ and the threshold voltage Vt of the memory transistor $M_F$ is gradually increased. Under this circumstance, the channel current $I_{CH}$ is gradually increased, but the magnitude of the channel current $I_{CH}$ is lower than the magnitude of the magnitude of the limited current $I_{LIM}$. That is, the magnitude of the channel current $I_{CH}$ is lower than 20 μA.

In the time interval between the time point $t_{b2}$ and the time point $t_{b3}$, the magnitude of the channel current $I_{CH}$ reaches 20 μA. That is, the magnitude of the channel current is equal to the magnitude of the limited current $I_{LIM}$. Since the channel current $I_{CH}$ is unable to be increased and the difference between the gate-source voltage $V_{GS}$ of the memory transistor $M_F$ and the threshold voltage Vt of the memory transistor $M_F$ is gradually increased, the voltage at the node d is increased. That is, the source-drain voltage $V_{SD}$ of the memory transistor $M_F$ is decreased. Under this circumstance, the source-drain voltage $V_{SD}$ of the memory transistor $M_F$ is still higher than 3.5V. Consequently, the CHHIHEI effect is continuously generated, and hot electrons are injected into the charge trapping layer of the memory transistor $M_F$.

In the time interval between the time point $t_{b3}$ and the time point $t_b$, the difference between the gate-source voltage $V_{GS}$ of the memory transistor $M_F$ and the threshold voltage Vt is gradually increased. Consequently, the source-drain voltage $V_{SD}$ of the memory transistor $M_F$ is gradually continuously decreased. In addition, the source-drain voltage $V_{SD}$ of the memory transistor $M_F$ is lower than 3.5V. Meanwhile, the CHHIHEI effect cannot be generated. Consequently, the hot electrons are no longer injected into the charge trapping layer of the memory transistor $M_F$, and the threshold voltage Vt is not changed.

Similarly, in the beginning of the time period $T_3$ (i.e., at the time point $t_a$), the control signal $S_{CL}$ is increased to ($V_{CLi}+\Delta 2V_2$). Under this circumstance, the memory transistor $M_F$ is turned off, and the source-drain voltage $V_{SD}$ of the memory transistor $M_F$ is 6V.

In the time interval between the time point $t_{c1}$ and the time point tot, the memory transistor $M_F$ is slightly turned on, and the channel current $I_{CH}$ is generated. In addition, the magnitude of the channel current $I_{CH}$ is lower than the limited current $I_{LIM}$. Meanwhile, since the CHHIHEI effect is generated, the gate current $I_G$ corresponding to the hot electrons is larger. Consequently, a greater number of hot electrons are injected into the charge trapping layer of the memory transistor $M_F$.

In the time interval between the time point $t_{c2}$ and the time point $t_{c3}$, the magnitude of the channel current $I_{CH}$ reaches the limited current $I_{LIM}$. The source-drain voltage $V_{SD}$ of the memory transistor $M_F$ is decreased. The CHHIHEI effect is continuously generated. In addition, hot electrons are injected into the charge trapping layer of the memory transistor $M_F$.

In the time interval between the time point $t_{c3}$ and the time point $t_d$, the magnitude of the channel current $I_{CH}$ reaches the limited current $I_{LIM}$. The source-drain voltage $V_{SD}$ of the memory transistor $M_F$ is gradually continuously decreased to be lower than 3.5V. Meanwhile, the CHHIHEI effect cannot be generated. Consequently, the hot electrons are no longer injected into the charge trapping layer of the memory transistor $M_F$, and the threshold voltage Vt is not changed.

Similarly, in the time interval between the time point to and the time point $t_{a1}$ of the time period $T_4$, the memory transistor $M_F$ is turned off. In addition, the source-drain voltage $V_{SD}$ of the memory transistor $M_F$ is 6V.

In the time interval between the time point $t_{a1}$ and the time point $t_{d3}$, the CHHIHEI effect is generated. Consequently, hot electrons are injected into the charge trapping layer of the memory transistor $M_F$.

In the time interval between the time point $t_{d3}$ and the time point $t_e$, the magnitude of the channel current $I_{CH}$ reaches the limited current $I_{LIM}$. The source-drain voltage $V_{SD}$ of the memory transistor $M_F$ is gradually continuously decreased to be lower than 3.5V. Meanwhile, the CHHIHEI effect cannot be generated. Consequently, the hot electrons are no longer injected into the charge trapping layer of the memory transistor $M_F$, and the threshold voltage Vt is not changed.

As can be seen from the above descriptions of FIGS. 4A to 4D, the CHHIHEI effect is generated in each of the time periods $T_1$~$T_4$. Since hot electrons are injected into the charge trapping layer of the memory transistor $M_F$, the program efficiency can be maintained. Moreover, the channel current $I_{CH}$ of the memory transistor $M_F$ is limited to the current value lower than 20 μA. Consequently, the power consumption during the program action can be effectively reduced.

Moreover, as shown in FIG. 4B, the lengths of the time periods $T_1$ $T_4$ are equal. In addition, the average falling rates of the control signal $S_{CL}$ in the time periods $T_1$ $T_4$ are identical. It is noted that numerous modifications and alterations may be made while retaining the teachings of the invention. For example, in another embodiment, the lengths of different time periods are different. Alternatively, the average falling rates of the control signal in different time periods are different. For example, the control signal is decreased at a first average falling rate in the time period $T_1$, and the control signal $S_{CL}$ is decreased at a second average falling rate in the time period $T_2$, wherein the first average falling rate is higher than the second average falling rate.

As shown in FIG. 4B, the control signal $S_{CL}$ is increased by a voltage increment $\Delta V_2$ at the start point of each of the time periods $T_1$~$T_4$. For example, the control signal $S_{CL}$ is equal to an initial voltage $V_{CLi}$ at the time point $t_a$, the control signal $S_{CL}$ is equal to ($V_{CLi}+\Delta V_2$) at the time point $t_b$, the control signal $S_{CL}$ is equal to ($V_{CLi}+2\Delta V_2$) at the time point $t_c$, and the control signal $S_{CL}$ is equal to ($V_{CLi}+3\Delta V_2$) at the time point $t_d$. In some other embodiments, the voltage increments of the control signal $S_{CL}$ at different start points of the time periods $T_1$~$T_4$ are different.

Figure 5:
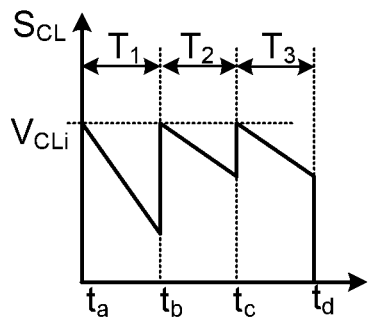
FIG. 5 shows another example of the schematic timing diagram illustrating a waveform of a control signal when a program action is performed on the non-volatile memory cell.

As shown in FIG. 5, it shows another example of the schematic timing diagram illustrating a waveform of a control signal $S_{CL}$ when a program action is performed on the non-volatile memory cell. In this example, the control signal $S_{CL}$ is fixed at an initial voltage $V_{CLi}$ at the start point of each of the time periods $T_1$~$T_3$. The maximum initial voltage $V_{CLi}$ of the control signal $S_{CL}$ can be determined according to the safe operation area (SOA) criteria of the memory transistor $M_F$. In other words, the voltage increment $\Delta V_2$ at the start point of each of the time periods $T_1$~$T_3$ is equal to zero. Moreover, falling rates of the control signal $S_{CL}$ in the time periods $T_1$~$T_3$ maybe different. For example, the control signal $S_{CL}$ is decreased at a first average falling rate in the time period $T_1$, the control signal $S_{CL}$ is decreased at a second average falling rate in the time period $T_2$ and in the time period $T_3$. The first average falling rate is higher than the second average falling rate.

Figure 6A:
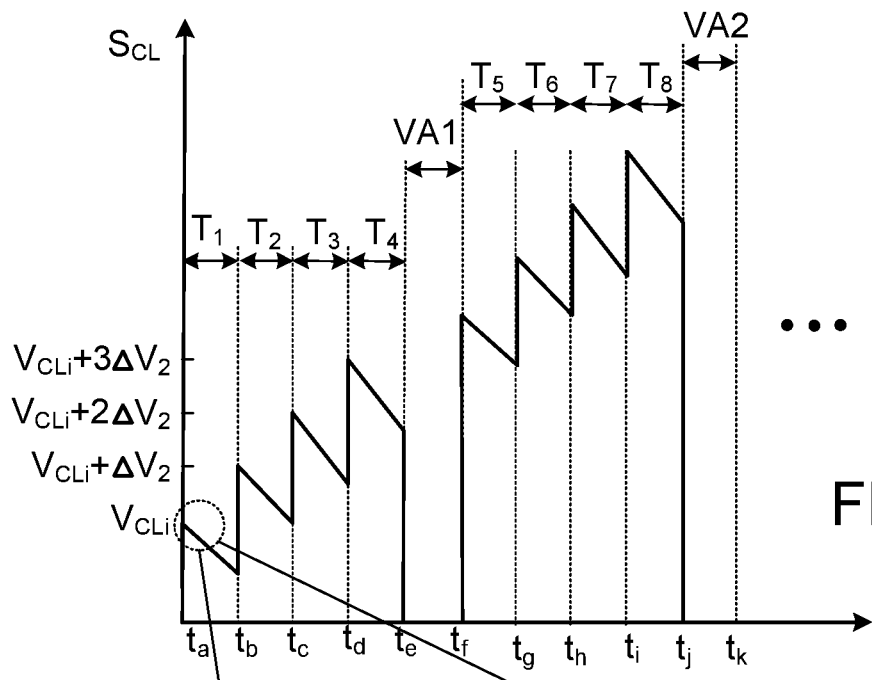
FIG. 6A is a schematic timing diagram illustrating a waveform of a control signal when a program action and a verification action are performed.

In an embodiment, the present invention further provides a method of verifying the non-volatile memory cell. For example, in the program cycle, a verification action is performed on the non-volatile memory cell after several time periods. FIG. 6A is a schematic timing diagram illustrating a waveform of a control signal $S_{CL}$ when a program action and a verification action are performed. For example, after the time periods $T_1$~$T_4$ (e.g., at the time point $t_e$), a verification action VA1 is performed on the non-volatile memory cell. When the verification action VA1 is performed, the non-volatile memory cell is read. Moreover, a control circuit (not shown) judges whether the storage state of the non-volatile memory cell is changed from the first storage state to the second storage state.

If the result of the verification action VA1 indicates that the non-volatile memory cell is in the first storage state, it means that the program action needs to be performed again. Consequently, in the next time periods $T_5$~$T_8$ (i.e., from the time point $t_f$ to the time point $t_j$), the control signal $S_{CL}$ is continuously provided to the non-volatile memory cell.

After the time periods $T_5$~$T_8$ (e.g., at the time point ti), another verification action VA2 is performed on the non-volatile memory cell. If the result of the verification action VA2 indicates that the non-volatile memory cell is in the second storage state, it means that the program action is completed. Whereas, if the result of the verification action VA2 indicates that the non-volatile memory cell is in the first storage state, it means that the program action needs to be performed again.

Figure 6B:
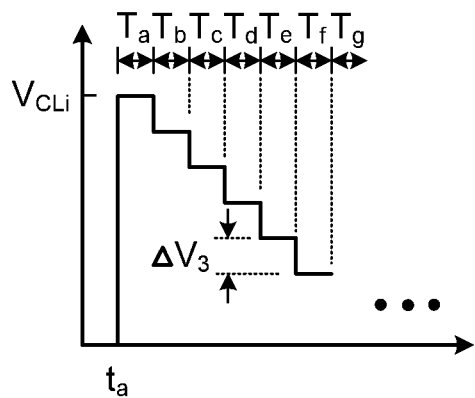
FIGS. 6B and 6C are schematic timing diagrams illustrating two variant examples of decreasing the control signal in a time period.
Figure 6C:
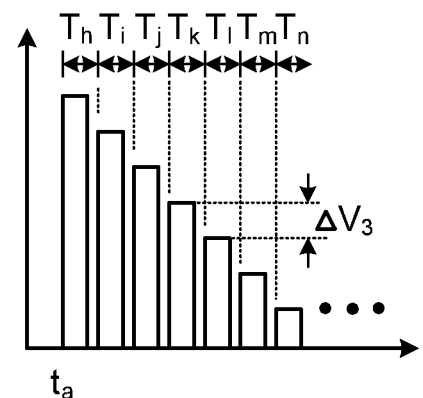

In the embodiment of FIG. 4B, the control signal $S_{CL}$ is decreased at a constant falling rate in each time period. It is noted that the examples of decreasing the control signal $S_{CL}$ are not restricted. FIGS. 6B and 6C are schematic timing diagrams illustrating two variant examples of decreasing the control signal $S_{CL}$ in a time period.

As shown in FIG. 6B, the time interval $T_1$ is divided into plural sub-periods $T_a$~$T_g$. The control signal $S_{CL}$ contains plural pulses. Each of the plural pulses has a duty cycle of 100%. Moreover, each pulse has a corresponding pulse height. The pulse height of the first pulse is equal to the initial voltage $V_{CLi}$. After the first pulse, the pulse height of each pulse is smaller than the pulse height of the previous pulse. For example, the difference between the pulse heights of every two consecutive pulses is equal to a voltage decrement $\Delta V_3$. In some other embodiments, the difference between the pulse heights of every two consecutive pulses is not restricted to the voltage decrement $\Delta V_3$.

As shown in FIG. 6C, the time interval $T_1$ is divided into plural sub-periods $T_h$~$T_n$. The control signal $S_{CL}$ contains plural pulses. Each of the plural pulses has a duty cycle lower than 100%. For example, the duty cycle of each pulse is 75%. Moreover, each pulse has a corresponding pulse height. The pulse height of the first pulse is equal to the initial voltage $V_{CLi}$. After the first pulse, the pulse height of each pulse is smaller than the pulse height of the previous pulse. For example, the difference between the pulse heights of every two consecutive pulses is equal to a voltage decrement $\Delta V_3$. In some other embodiments, the difference between the pulse heights of every two consecutive pulses is not restricted to the voltage decrement $\Delta V_3$.

In FIGS. 6B and 6C, the lengths of the sub-periods $T_a$~$T_g$ are equal, and the lengths of the sub-periods $T_h$~$T_n$ are equal. In some other embodiments, the lengths of the sub-periods are not equal.

From the above descriptions, the present invention provides a programming method of a non-volatile memory cell. When a program action is performed, the upper limit of the channel current $I_{CH}$ of the non-volatile memory cell is controlled to be lower than or equal to a limited current $I_{LIM}$. Furthermore, the control signal is adjusted during the program action. Consequently, the memory transistor of the non-volatile memory cell is selectively operated in an off state or a slightly-turned-on state. In this way, hot electrons can be injected into the charge trapping layer of the memory transistor, and the storage state of the non-volatile memory cell is changed from a first storage state to a second storage state.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A programming method of a non-volatile memory cell, the non-volatile memory cell comprising a memory transistor, the programming method comprising steps of:
   limiting a channel current of the memory transistor lower than or equal to a limited current; and
   providing a program voltage to a source terminal of the memory transistor, and providing a control signal to a gate terminal of the memory transistor,
   wherein during a program cycle, a program action is performed, and the program cycle contains plural time periods,
   wherein in a first time period of the plural time periods, the control signal is gradually decreased from a first voltage value, so that the memory transistor is firstly turned off and then turned on, wherein when the memory transistor is turned on, plural hot electrons are injected into the memory transistor,
   wherein in a second time period of the plural time periods after the first time period, the control signal is gradually decreased from a second voltage value, so that the memory transistor is firstly turned off and then turned on, wherein when the memory transistor is turned on, the plural hot electrons are injected into the memory transistor, wherein the second voltage value is equal to the first voltage value plus a first voltage increment.

2. The programming method as claimed in claim 1, wherein the non-volatile memory cell further comprises a select transistor, wherein a source terminal of the select transistor is connected with a source line, a gate terminal of the select transistor is connected with a word line, a drain terminal of the select transistor is connected with the source terminal of the memory transistor, the gate terminal of the memory transistor is connected with a control line, and a current limiter is connected between the drain terminal of the memory transistor and a bit line for limiting the channel current lower than or equal to the limited current, wherein when the program action is performed, the source line receives the program voltage, the word line receives an on voltage, the control line receives the control signal, and the bit line receives a ground voltage.

3. The programming method as claimed in claim 1, wherein the first voltage increment is greater than or equal to zero, the second voltage value is higher than the first voltage value, or the second voltage value is equal to the first voltage value.

4. The programming method as claimed in claim 1, wherein the current limiter is a current source, and the current source provides the limited current.

5. The programming method as claimed in claim 1, wherein the control signal is decreased from the first voltage value at a first average falling rate in the first time period, and the control signal is decreased from the second voltage value at a second average falling rate in the second time period, wherein the first average falling rate is higher than or equal to the second average falling rate.

6. The programming method as claimed in claim 1, wherein in a third time period after the second time period of the plural time periods, the control signal is gradually decreased from a third voltage value, so that the memory transistor is firstly turned off and then turned on, wherein when the memory transistor is turned on, a channel hot hole induced hot electron injection effect is generated, and the plural hot electrons are injected into a charge trapping layer of the memory transistor, wherein the third voltage value is equal to the second voltage value plus a second voltage increment.

7. The programming method as claimed in claim 6, wherein the first voltage increment is equal to the second voltage increment.

8. The programming method as claimed in claim 6, wherein after the plural time periods, a verification action is performed to judge whether a storage state of the non-volatile memory cell is changed from a first storage state to a second storage state.

9. The programming method as claimed in claim 1, wherein in the first time period, the control signal contains plural pulses, wherein each pulse has a pulse height, and the pulse height of each pulse is lower than the pulse height of the previous pulse, wherein the pulse height of a first pulse of the plural pulses is equal to the first voltage value.

10. The programming method as claimed in claim 9, wherein a duty cycle of each pulse is 100%.

11. The programming method as claimed in claim 9, wherein a duty cycle of each pulse is smaller than 100%.

12. The programming method as claimed in claim 1, wherein the memory transistor is P-type transistor.

13. The programming method as claimed in claim 1, wherein the non-volatile memory cell further comprises a select transistor; wherein a source terminal of the select transistor is connected with a source line, a gate terminal of the select transistor is connected with a word line, a drain terminal of the select transistor is connected with the source terminal of the memory transistor, the gate terminal of the memory transistor is connected with a control line; wherein when the program action is performed, the source line receives the program voltage, the word line receives an on voltage, the control line receives the control signal, and the bit line receives a ground voltage; and, wherein the on voltage is capable of limiting a conductivity capability of the select transistor to determine the limited current.

* * * * *